(12) United States Patent
Pan

(10) Patent No.: US 8,934,199 B1
(45) Date of Patent: Jan. 13, 2015

(54) DISK DRIVE HEAD SUSPENSION TAIL WITH BOND PAD EDGE ALIGNMENT FEATURES

(71) Applicant: Western Digital Technologies, Inc., Irvine, CA (US)

(72) Inventor: Tzong-Shii Pan, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/231,032

(22) Filed: Mar. 31, 2014

(51) Int. Cl.
G11B 5/127 (2006.01)

(52) U.S. Cl.
USPC ......................................................... 360/245.4

(58) Field of Classification Search
USPC ......................................................... 360/245.4
See application file for complete search history.

(56) References Cited

U.S. PATENT DOCUMENTS

| | | |
|---|---|---|
| 4,714,435 A | 12/1987 | Stipanuk et al. |
| 5,348,488 A | 9/1994 | Green et al. |
| 5,415,555 A | 5/1995 | Sobhani |
| 5,422,764 A | 6/1995 | McIlvanie |
| 5,465,186 A | 11/1995 | Bajorek et al. |
| 5,612,841 A | 3/1997 | Johnson |
| 5,631,786 A | 5/1997 | Erpelding |
| 5,668,684 A | 9/1997 | Palmer et al. |
| 5,827,084 A | 10/1998 | Biernath |
| 5,861,661 A | 1/1999 | Tang et al. |
| 5,903,056 A | 5/1999 | Canning et al. |
| 5,903,413 A | 5/1999 | Brooks, Jr. et al. |
| 5,920,465 A | 7/1999 | Tanaka |
| 5,947,750 A | 9/1999 | Alcoe et al. |
| 6,007,669 A | 12/1999 | Crumly et al. |
| 6,036,813 A | 3/2000 | Schulz et al. |
| 6,075,673 A | 6/2000 | Wilde et al. |
| 6,076,256 A | 6/2000 | Drake et al. |
| 6,097,575 A | 8/2000 | Trang et al. |
| 6,125,014 A | 9/2000 | Riedlin, Jr. |
| 6,125,015 A | 9/2000 | Carlson et al. |
| 6,130,863 A | 10/2000 | Wang et al. |
| 6,134,770 A | 10/2000 | Heeren et al. |
| 6,137,656 A | 10/2000 | Levi et al. |
| 6,144,528 A | 11/2000 | Anaya-Dufresne et al. |
| 6,145,188 A | 11/2000 | Brooks, Jr. et al. |
| 6,147,838 A | 11/2000 | Chang et al. |
| 6,151,196 A | 11/2000 | Carlson et al. |
| 6,178,064 B1 | 1/2001 | Chang et al. |

(Continued)

OTHER PUBLICATIONS

US 7,337,529, 8/2014, Bennin et al. (withdrawn).

(Continued)

Primary Examiner — Mark Blouin

(57) ABSTRACT

A head gimbal assembly for a disk drive includes a flexure having a proximal tongue portion that connects to a head and a flexure tail that extends to a distal flexure tail terminal region. A dielectric layer in the distal flexure tail terminal region is bounded by first and second longitudinal edges. The distal flexure tail terminal region includes a plurality of flexure bond pads in electrical communication with the head. A structural layer of the distal flexure tail terminal region includes a first plurality of discontinuous islands. Each of at least three of the first plurality of discontinuous islands extends over the first longitudinal edge by a protrusion distance. Adjacent ones of the at least three of the first plurality of discontinuous islands are separated by a first longitudinal spacing, measured along the first longitudinal edge, that is no greater than thirty times the protrusion distance.

26 Claims, 6 Drawing Sheets

(56) References Cited

U.S. PATENT DOCUMENTS

| | | | |
|---|---|---|---|
| 6,181,522 B1 | 1/2001 | Carlson | |
| 6,181,673 B1 | 1/2001 | Wilde et al. | |
| 6,185,075 B1 | 2/2001 | Tsujino et al. | |
| 6,212,046 B1 | 4/2001 | Albrecht et al. | |
| 6,228,689 B1 | 5/2001 | Liu | |
| 6,229,672 B1 | 5/2001 | Lee et al. | |
| 6,236,543 B1 | 5/2001 | Han et al. | |
| 6,246,547 B1 | 6/2001 | Bozorgi et al. | |
| 6,249,404 B1 | 6/2001 | Doundakov et al. | |
| 6,330,131 B1 | 12/2001 | Nepela et al. | |
| 6,339,518 B1 | 1/2002 | Chang et al. | |
| 6,349,017 B1 | 2/2002 | Schott | |
| 6,351,352 B1 | 2/2002 | Khan et al. | |
| 6,360,426 B1 | 3/2002 | Summers et al. | |
| 6,367,144 B1 | 4/2002 | Holaway et al. | |
| 6,373,660 B1 | 4/2002 | Lam et al. | |
| 6,378,195 B1 | 4/2002 | Carlson | |
| 6,381,099 B1 | 4/2002 | Mei | |
| 6,382,499 B1 | 5/2002 | Satoh et al. | |
| 6,386,434 B1 | 5/2002 | Wong | |
| 6,399,889 B1 | 6/2002 | Korkowski et al. | |
| 6,522,504 B1 | 2/2003 | Casey | |
| 6,529,350 B1 | 3/2003 | Itoh | |
| 6,538,850 B1 | 3/2003 | Hadian et al. | |
| 6,583,953 B1 | 6/2003 | Han et al. | |
| 6,614,623 B2 | 9/2003 | Nakamura et al. | |
| 6,634,086 B2 | 10/2003 | Korkowski et al. | |
| 6,639,757 B2 | 10/2003 | Morley et al. | |
| 6,646,832 B2 | 11/2003 | Anaya-Dufresne et al. | |
| 6,656,772 B2 | 12/2003 | Huang | |
| 6,661,612 B1 | 12/2003 | Peng | |
| 6,665,146 B2 | 12/2003 | Hawwa et al. | |
| 6,672,879 B2 | 1/2004 | Neidich et al. | |
| 6,690,545 B1 | 2/2004 | Chang et al. | |
| 6,703,566 B1 | 3/2004 | Shiraishi et al. | |
| 6,704,173 B1 | 3/2004 | Lam et al. | |
| 6,708,389 B1 | 3/2004 | Carlson et al. | |
| 6,717,773 B2 | 4/2004 | Hawwa et al. | |
| 6,721,142 B1 | 4/2004 | Meyer et al. | |
| 6,741,426 B2 * | 5/2004 | Girard | 360/245.4 |
| 6,744,599 B1 | 6/2004 | Peng et al. | |
| 6,757,136 B2 | 6/2004 | Buske et al. | |
| 6,757,137 B1 | 6/2004 | Mei | |
| 6,758,686 B2 | 7/2004 | Burdick | |
| 6,765,763 B2 | 7/2004 | SeeToh et al. | |
| 6,771,468 B1 | 8/2004 | Levi et al. | |
| 6,796,018 B1 | 9/2004 | Thornton | |
| 6,801,402 B1 | 10/2004 | Subrahmanyam et al. | |
| 6,856,489 B2 | 2/2005 | Hawwa et al. | |
| 6,873,496 B1 | 3/2005 | Sun et al. | |
| 6,912,103 B1 | 6/2005 | Peng et al. | |
| 6,937,439 B1 | 8/2005 | Chang et al. | |
| 6,937,441 B2 * | 8/2005 | Okamoto et al. | 360/245.2 |
| 6,956,718 B1 | 10/2005 | Kulkarni et al. | |
| 6,967,820 B2 * | 11/2005 | Horie et al. | 360/244.2 |
| 6,972,930 B1 | 12/2005 | Tang et al. | |
| 6,992,862 B2 | 1/2006 | Childers et al. | |
| 7,006,330 B1 | 2/2006 | Subrahmanyam et al. | |
| 7,006,331 B1 | 2/2006 | Subrahmanyam et al. | |
| 7,010,847 B1 | 3/2006 | Hadian et al. | |
| 7,019,945 B1 | 3/2006 | Peng et al. | |
| 7,027,264 B1 | 4/2006 | Subrahmanyam et al. | |
| 7,059,868 B1 | 6/2006 | Yan | |
| 7,075,701 B2 | 7/2006 | Novotny et al. | |
| 7,085,104 B1 | 8/2006 | Hadian et al. | |
| 7,099,117 B1 | 8/2006 | Subrahmanyam et al. | |
| 7,110,222 B2 | 9/2006 | Erpelding | |
| 7,154,708 B2 | 12/2006 | Chhabra et al. | |
| 7,174,622 B2 | 2/2007 | Meyer et al. | |
| 7,205,484 B2 | 4/2007 | Shiraishi et al. | |
| 7,245,458 B2 | 7/2007 | Zhang et al. | |
| 7,289,299 B1 | 10/2007 | Sun et al. | |
| 7,298,593 B2 | 11/2007 | Yao et al. | |
| 7,307,816 B1 | 12/2007 | Thornton et al. | |
| 7,315,435 B1 | 1/2008 | Pan | |
| 7,315,436 B1 | 1/2008 | Sanchez | |
| 7,359,154 B2 | 4/2008 | Yao et al. | |
| 7,372,669 B2 | 5/2008 | Deguchi et al. | |
| 7,375,874 B1 | 5/2008 | Novotny et al. | |
| 7,388,733 B2 | 6/2008 | Swanson et al. | |
| 7,391,594 B2 | 6/2008 | Fu et al. | |
| 7,394,139 B2 | 7/2008 | Park et al. | |
| 7,414,814 B1 | 8/2008 | Pan | |
| 7,436,631 B1 | 10/2008 | Fanslau, Jr. et al. | |
| 7,440,236 B1 | 10/2008 | Bennin et al. | |
| 7,450,346 B2 | 11/2008 | Arya et al. | |
| 7,474,508 B1 | 1/2009 | Li et al. | |
| 7,477,486 B1 | 1/2009 | Sun et al. | |
| 7,482,800 B2 | 1/2009 | Ooyabu et al. | |
| 7,515,240 B2 | 4/2009 | Lu et al. | |
| 7,518,830 B1 | 4/2009 | Panchal et al. | |
| 7,522,382 B1 | 4/2009 | Pan | |
| 7,525,767 B2 | 4/2009 | Erpelding | |
| 7,525,769 B2 | 4/2009 | Yao et al. | |
| 7,538,981 B1 | 5/2009 | Pan | |
| 7,593,190 B1 | 9/2009 | Thornton et al. | |
| 7,595,963 B1 | 9/2009 | Chen et al. | |
| 7,616,405 B2 | 11/2009 | Hu et al. | |
| 7,616,408 B2 | 11/2009 | Choi et al. | |
| 7,652,890 B2 | 1/2010 | Ohsawa et al. | |
| 7,697,102 B2 | 4/2010 | Hirakata et al. | |
| 7,729,089 B1 | 6/2010 | Hogan | |
| 7,760,470 B2 | 7/2010 | Wu et al. | |
| 7,764,467 B2 | 7/2010 | Hanya et al. | |
| 7,819,980 B2 | 10/2010 | Hsia et al. | |
| 7,876,664 B2 | 1/2011 | Tsukagoshi et al. | |
| 7,907,369 B1 | 3/2011 | Pan | |
| 7,995,310 B1 | 8/2011 | Pan | |
| 8,015,692 B1 | 9/2011 | Zhang et al. | |
| 8,030,576 B2 | 10/2011 | Kamei et al. | |
| 8,064,170 B1 | 11/2011 | Pan | |
| 8,068,314 B1 | 11/2011 | Pan et al. | |
| 8,081,400 B1 | 12/2011 | Hu | |
| 8,087,973 B1 | 1/2012 | Sladek et al. | |
| 8,089,730 B1 | 1/2012 | Pan et al. | |
| 8,111,483 B2 | 2/2012 | Arai | |
| 8,164,858 B1 | 4/2012 | Moravec et al. | |
| 8,169,746 B1 | 5/2012 | Rice et al. | |
| 8,194,355 B1 | 6/2012 | Pan et al. | |
| 8,199,437 B1 | 6/2012 | Sun et al. | |
| 8,208,224 B1 | 6/2012 | Teo et al. | |
| 8,218,268 B1 | 7/2012 | Pan | |
| 8,240,545 B1 | 8/2012 | Wang et al. | |
| 8,256,272 B1 | 9/2012 | Roajanasiri et al. | |
| 8,279,560 B1 | 10/2012 | Pan | |
| 8,295,012 B1 | 10/2012 | Tian et al. | |
| 8,295,013 B1 | 10/2012 | Pan et al. | |
| 8,295,014 B1 | 10/2012 | Teo et al. | |
| 8,320,084 B1 | 11/2012 | Shum et al. | |
| 8,325,446 B1 | 12/2012 | Liu et al. | |
| 8,325,447 B1 | 12/2012 | Pan | |
| 8,339,742 B1 | 12/2012 | Sladek et al. | |
| 8,339,747 B1 | 12/2012 | Hales et al. | |
| 8,339,748 B2 | 12/2012 | Shum et al. | |
| 8,343,363 B1 | 1/2013 | Pakpum et al. | |
| 8,345,519 B1 | 1/2013 | Pan | |
| 8,418,353 B1 | 4/2013 | Moravec et al. | |
| 8,441,896 B2 | 5/2013 | Wang et al. | |
| 8,446,694 B1 | 5/2013 | Tian et al. | |
| 8,456,643 B2 | 6/2013 | Prabhakaran et al. | |
| 8,456,776 B1 | 6/2013 | Pan | |
| 8,462,462 B1 | 6/2013 | Moravec et al. | |
| 8,467,153 B1 | 6/2013 | Pan et al. | |
| 8,477,459 B1 | 7/2013 | Pan | |
| 8,485,579 B2 | 7/2013 | Roajanasiri et al. | |
| 8,488,279 B1 | 7/2013 | Pan et al. | |
| 8,488,281 B1 | 7/2013 | Pan | |
| 8,490,211 B1 | 7/2013 | Leary | |
| 8,514,522 B1 | 8/2013 | Pan et al. | |
| 8,533,936 B1 | 9/2013 | Puttichaem et al. | |
| 8,545,164 B2 | 10/2013 | Choumwong et al. | |
| 8,553,365 B1 | 10/2013 | Shapiro et al. | |
| 8,564,909 B1 | 10/2013 | Dunn et al. | |
| 8,587,901 B1 | 11/2013 | Puttichaem et al. | |

(56) References Cited

U.S. PATENT DOCUMENTS

| | | |
|---|---|---|
| 8,593,764 B1 | 11/2013 | Tian et al. |
| 8,599,653 B1 | 12/2013 | Mallary et al. |
| 8,605,389 B1 | 12/2013 | Pan et al. |
| 8,611,050 B1 | 12/2013 | Moravec et al. |
| 8,611,052 B1 | 12/2013 | Pan et al. |
| 8,623,197 B1 | 1/2014 | Kobsiriphat et al. |
| 8,624,184 B1 | 1/2014 | Souza et al. |
| 8,665,566 B1 | 3/2014 | Pan et al. |
| 8,665,567 B2 | 3/2014 | Shum et al. |
| 8,665,677 B1 | 3/2014 | Panitchakan et al. |
| 8,665,690 B1 | 3/2014 | Moravec et al. |
| 8,693,144 B1 | 4/2014 | Pan et al. |
| 8,711,521 B2 | 4/2014 | Feng et al. |
| 8,756,795 B1 | 6/2014 | Moravec et al. |
| 8,758,083 B1 | 6/2014 | Rudy et al. |
| 8,760,812 B1 | 6/2014 | Chen et al. |
| 8,770,463 B1 | 7/2014 | Puttichaem et al. |
| 8,773,664 B1 | 7/2014 | Wang et al. |
| 8,792,212 B1 | 7/2014 | Pan et al. |
| 8,792,213 B1 | 7/2014 | Vijay et al. |
| 8,797,691 B1 | 8/2014 | Tian et al. |
| 2001/0017749 A1 | 8/2001 | Stefansky |
| 2001/0021596 A1 | 9/2001 | Tamura |
| 2003/0128474 A1 | 7/2003 | Schulz et al. |
| 2004/0228039 A1 | 11/2004 | Wu et al. |
| 2005/0030670 A1 | 2/2005 | Ando et al. |
| 2005/0042894 A1 | 2/2005 | Wu et al. |
| 2005/0237672 A1 | 10/2005 | Kamigama et al. |
| 2005/0243472 A1 | 11/2005 | Kamigama et al. |
| 2006/0098347 A1 | 5/2006 | Yao et al. |
| 2006/0146262 A1 | 7/2006 | Yu et al. |
| 2006/0157869 A1 | 7/2006 | Huang et al. |
| 2007/0075056 A1 | 4/2007 | Ho et al. |
| 2007/0153427 A1 | 7/2007 | Izumi et al. |
| 2007/0246251 A1 | 10/2007 | Shiraishi et al. |
| 2007/0279807 A1 | 12/2007 | Kobayashi et al. |
| 2008/0002303 A1 | 1/2008 | Wang et al. |
| 2008/0068757 A1 | 3/2008 | Kamigama et al. |
| 2008/0088975 A1 | 4/2008 | Bennin et al. |
| 2008/0225439 A1 | 9/2008 | Komura |
| 2009/0151994 A1 | 6/2009 | Ohsawa et al. |
| 2009/0207529 A1 | 8/2009 | Yao |
| 2009/0211789 A1 | 8/2009 | Yeates et al. |
| 2009/0253233 A1 | 10/2009 | Chang et al. |
| 2010/0007993 A1 | 1/2010 | Contreras et al. |
| 2010/0046351 A1 | 2/2010 | McCaslin et al. |
| 2010/0118444 A1 | 5/2010 | Rothenberg et al. |
| 2010/0176827 A1 | 7/2010 | Yamazaki et al. |
| 2010/0188778 A1 | 7/2010 | Castagna |
| 2010/0195474 A1 | 8/2010 | Tsukuda et al. |
| 2010/0220414 A1 | 9/2010 | Klarqvist et al. |
| 2011/0317309 A1 | 12/2011 | Shum et al. |
| 2012/0067626 A1 | 3/2012 | Mizutani |
| 2013/0244541 A1 | 9/2013 | Yaemglin et al. |
| 2013/0293982 A1 | 11/2013 | Huber |

OTHER PUBLICATIONS

Tzong-Shii Pan, et al., U.S. Appl. No. 12/195,288, filed Aug. 20, 2008, 16 pages.

\* cited by examiner

DISK DRIVE HEAD SUSPENSION TAIL WITH BOND PAD EDGE ALIGNMENT FEATURES

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head gimbal assembly (HGA) that typically includes a suspension assembly with a laminated flexure to carry the electrical signals to and from the head. The HGA, in turn, is a sub-component of a head stack assembly (HSA) that typically includes a plurality of HGAs, an actuator, and a flexible printed circuit. The plurality of HGAs are attached to various arms of the actuator.

Modern laminated flexures typically include conductive copper traces that are isolated from a stainless steel structural layer by a polyimide dielectric layer. So that the signals from/to the head can reach the flexible printed circuit (FPC) on the actuator body, each suspension assembly includes a flexure tail that extends away from the head along a corresponding actuator arm and ultimately attaches to the FPC adjacent the actuator body. That is, the flexure includes traces that extend from adjacent the head and continue along the flexure tail to electrical connection points. The FPC includes conductive electrical terminals that correspond to the electrical connection points of the flexure tail.

To facilitate electrical connection of the conductive traces of the flexure tails to the conductive electrical terminals of the FPC during the HSA manufacturing process, the flexure tails must first be properly positioned relative to the FPC so that the conductive traces of the flexure tails are aligned with the conductive electrical terminals of the FPC. Then the flexure tails must be held or constrained against the conductive electrical terminals of the FPC while the aforementioned electrical connections are made, e.g., by ultrasonic bonding, solder jet bonding, solder bump reflow, or anisotropic conductive film (ACF) bonding.

An anisotropic conductive film is typically an adhesive doped with conductive beads or cylindrical particles of uniform or similar diameter. As the doped adhesive is compressed and cured, it is heated and squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not conduct electricity parallel to the bonded surfaces, since the beads may not touch each other laterally—though axially each bead is forced to contact both of the surfaces to be bonded—hence the term "anisotropic").

In a high-volume manufacturing environment like that necessitated by the very competitive information storage device industry, there is a practical requirement for fast, cost-effective, and robust bonding of many bond pads simultaneously. Moreover, it is desirable for the bonding process to be automated, which, to be practical in a high volume manufacturing operation, would require the automated bonding equipment to be able to quickly determine and achieve proper alignment of the electrical connection points and terminals. After alignment, sufficient uniform pressure must be maintained during adhesive curing, such that a single layer of conductive beads in an ACF makes contact with both opposing surfaces to be bonded.

Accordingly, there is a need in the art for an improved HGA design that may facilitate automated rapid and reliable alignment and electrical connection of the conductive traces of a flexure tail to the conductive electrical terminals of a FPC, in the context of high volume HSA manufacture.

DESCRIPTION OF THE PREFERRED EMBODIMENTS

Figure 1:
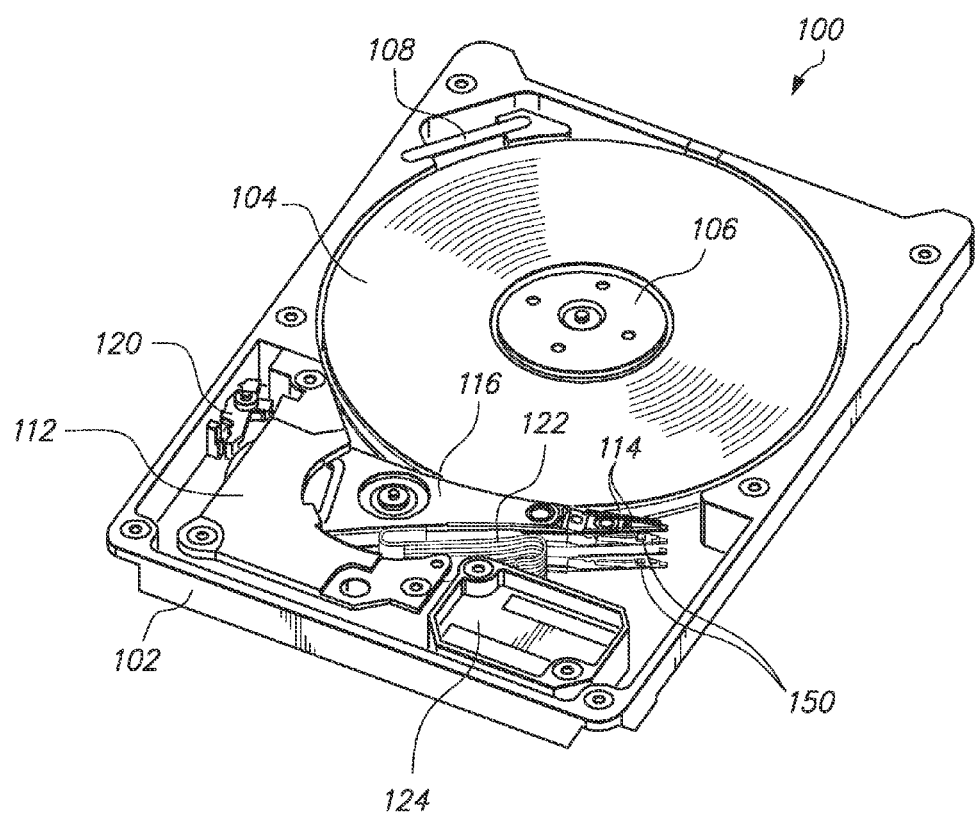
FIG. 1 is a top perspective view of a disk drive capable of including an embodiment of the present invention.

FIG. 1 is a top perspective view of a disk drive 100 capable of including an embodiment of the present invention. The disk drive 100 includes a disk drive base 102 and two annular magnetic disks 104. The disk drive 100 further includes a spindle 106, rotatably mounted on the disk drive base 102, for rotating the disks 104. The rotation of the disks 104 establishes air flow through recirculation filter 108. In other embodiments, disk drive 100 may have only a single disk, or alternatively, more than two disks.

The disk drive 100 further includes an actuator 116 that is rotatably mounted on disk drive base 102. Voice coil motor 112 rotates the actuator 116 through a limited angular range so that at least one head gimbal assembly (HGA) 114 is desirably positioned relative to one or more tracks of information on a corresponding one of the disks 104. In the embodiment of FIG. 1, the actuator 116 includes three arms upon which four HGAs 114 are attached, each corresponding to a surface of one of the two disks 104. However in other embodiments fewer or more HGAs 114 may be included depending on the number of disks 104 that are included and whether the disk drive 100 is depopulated. Each HGA 114 includes a head 150 for reading and writing data from and to one of the disks 104. The actuator 116 may occasionally be latched at an extreme angular position within the limited angular range, by latch 120. Electrical signals to/from the HGAs 114 are carried to other drive electronics via a flexible printed circuit that includes a flex cable 122 (preferably including a preamplifier circuit) and flex cable bracket 124.

Figure 2:
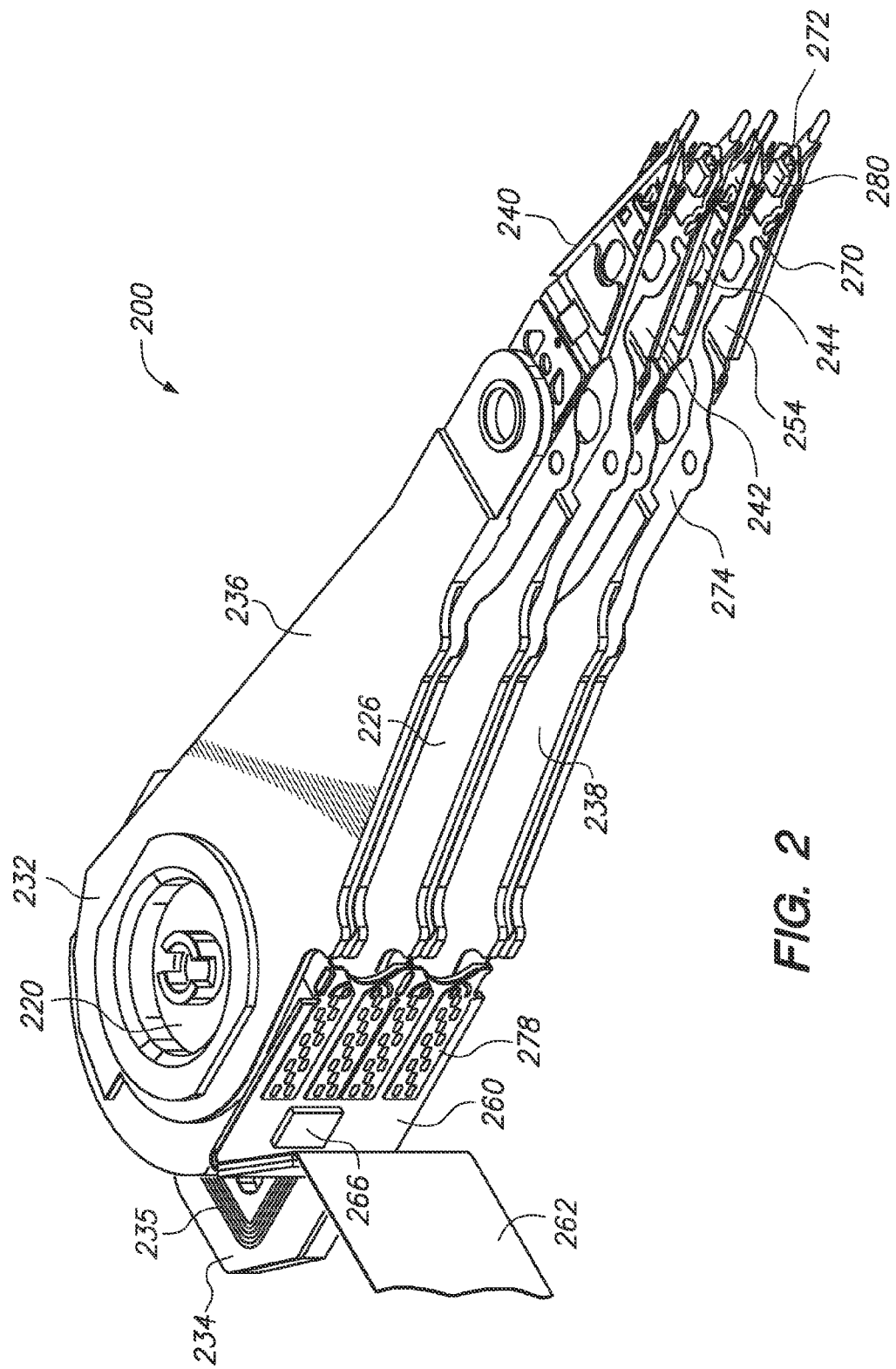
FIG. 2 is a perspective view of a head stack assembly (HSA) capable of including an embodiment of the present invention.

FIG. 2 is a perspective view of a head stack assembly (HSA) 200 capable of including an embodiment of the present invention. The HSA 200 includes an actuator body 232 and a plurality of actuator arms 226, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 236, 238. The HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam (the part of the HGA 254 to which the numerical label 254 points). The laminated flexure 270 may include a structural layer (e.g. stainless steel), a dielectric layer (e.g. polyimide), and a conductive layer into which traces are patterned (e.g. copper). The HSA 200 also includes a flexible printed circuit (FPC) 260 adjacent the actuator body 232. The FPC 260 includes a flex cable 262 and a preamplifier 266. The FPC 260 may comprise a laminate that includes two or more conventional dielectric and conductive layer materials (e.g. one or more polymeric materials, copper, etc.). The laminated flexure 270 includes a flexure tail 274 that runs along the actuator arm 238 to a terminal region 278 of the laminated flexure 270 that is electrically connected to bond pads of the FPC 260.

Methods of electrical connection of the flexure tails (e.g. flexure tail 274) to the FPC 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed. Maintaining alignment and sufficient uniform pressure and temperature to groups of bond pads may be desirable during this process, and may be facilitated by certain inventive structural features in the terminal regions of the flexure tails.

Figure 3:
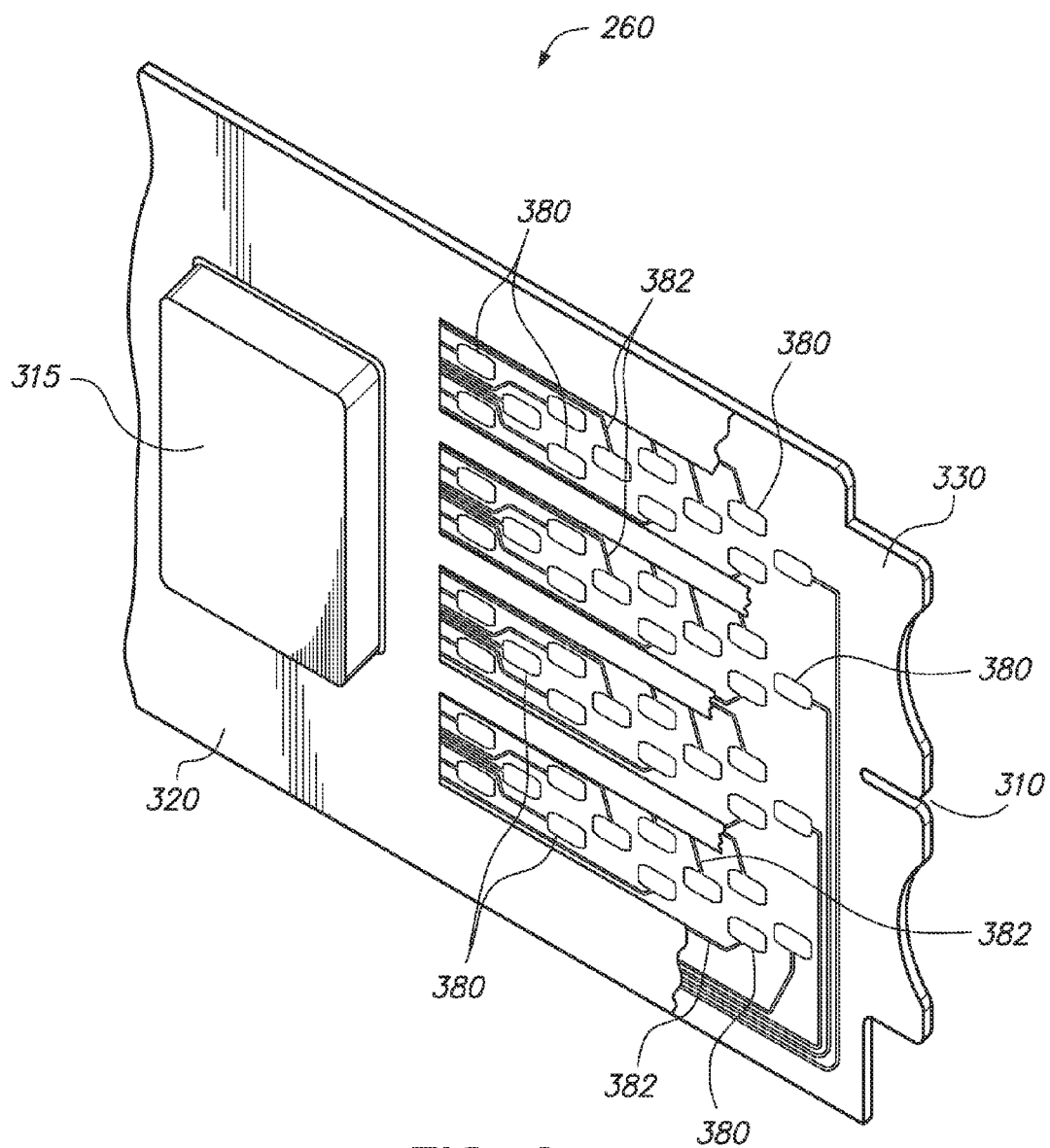
FIG. 3 is a perspective view of a portion of a flexible printed circuit (FPC) according to an embodiment of the present invention.

FIG. 3 depicts the FPC 260 before flexure tail terminal regions (i.e. the portion of each flexure tail that overlaps the FPC, for example, flexure tail terminal region 278) are bonded thereto. The FPC 260 includes electrical conduits 382 on an FPC dielectric substrate 330. The electrical conduits 382 terminate at FPC bond pads 380, which are aligned with and connected to flexure bond pads of the terminal regions (e.g. flexure tail terminal region 278) of the HGA flexure tails. The FPC electrical conduits 382 may connect to a pre-amplifier chip 315 (shown exploded from the FPC 260 in FIG. 3). Two of the HGA flexure tails may pass through the FPC slit 310 to help facilitate their support and alignment.

The FPC 260 may include an optional insulative cover layer 320, having windows exposing the regions where the flexure tail terminal regions and the pre-amplifier chip 315 are bonded thereto. The cover layer 320 is shown partially cut away in the view of FIG. 3, so that the electrical conduits 382 can be better depicted. In an alternative embodiment, the FPC 260 may have an upper conductive layer that includes the FPC bond pads 380, with the electrical conduits 382 pertaining to a lower conductive layer that is separated from the upper conductive layer by a dielectric layer (e.g. with the FPC bond pads being connected to the electrical conduits through vias in such dielectric layer). Such an alternative embodiment would have no need for an insulative cover layer like the cover layer 320.

Figure 4:
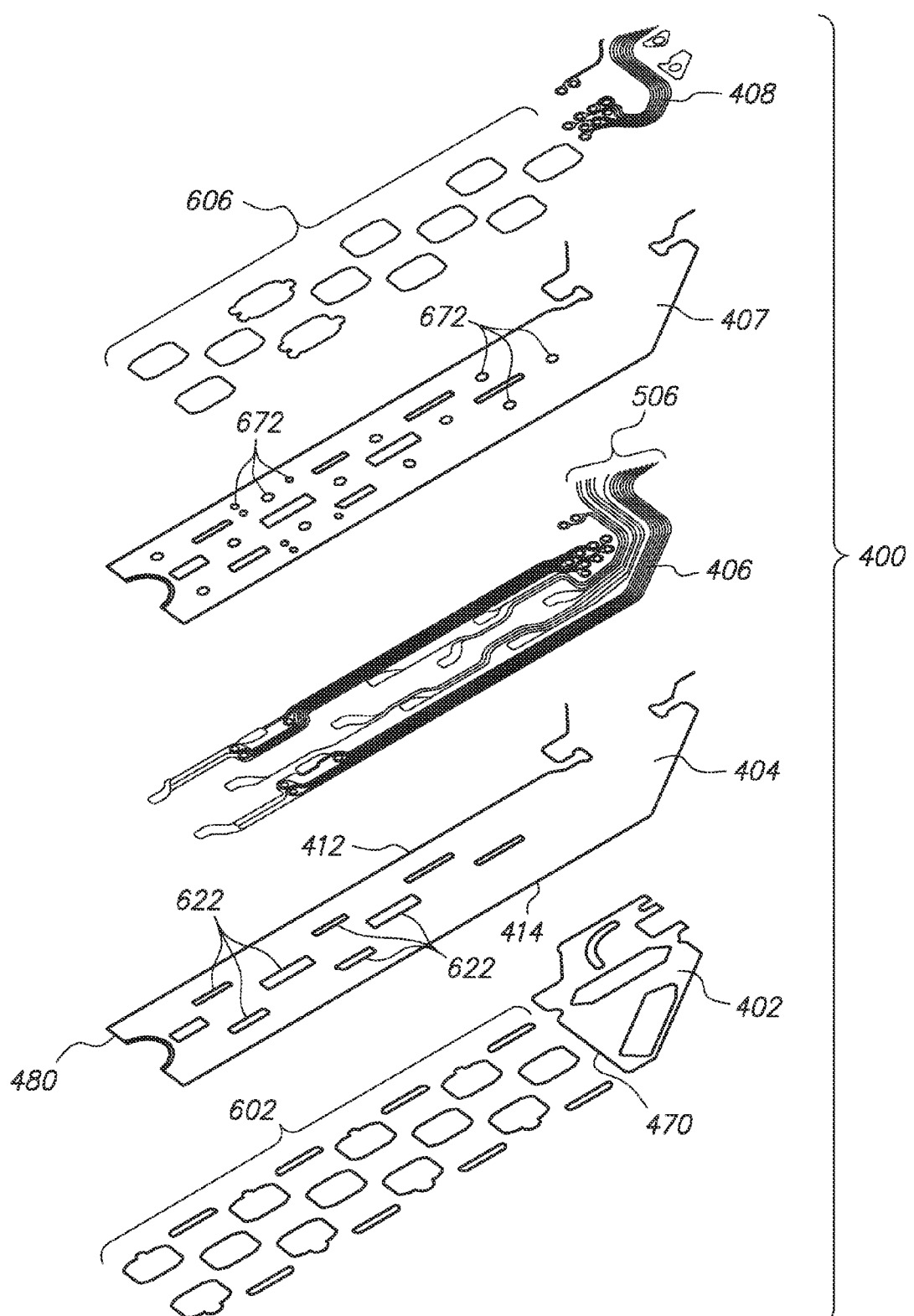
FIG. 4 is an exploded perspective view of a flexure tail terminal region, according to an embodiment of the present invention.
Figure 5:
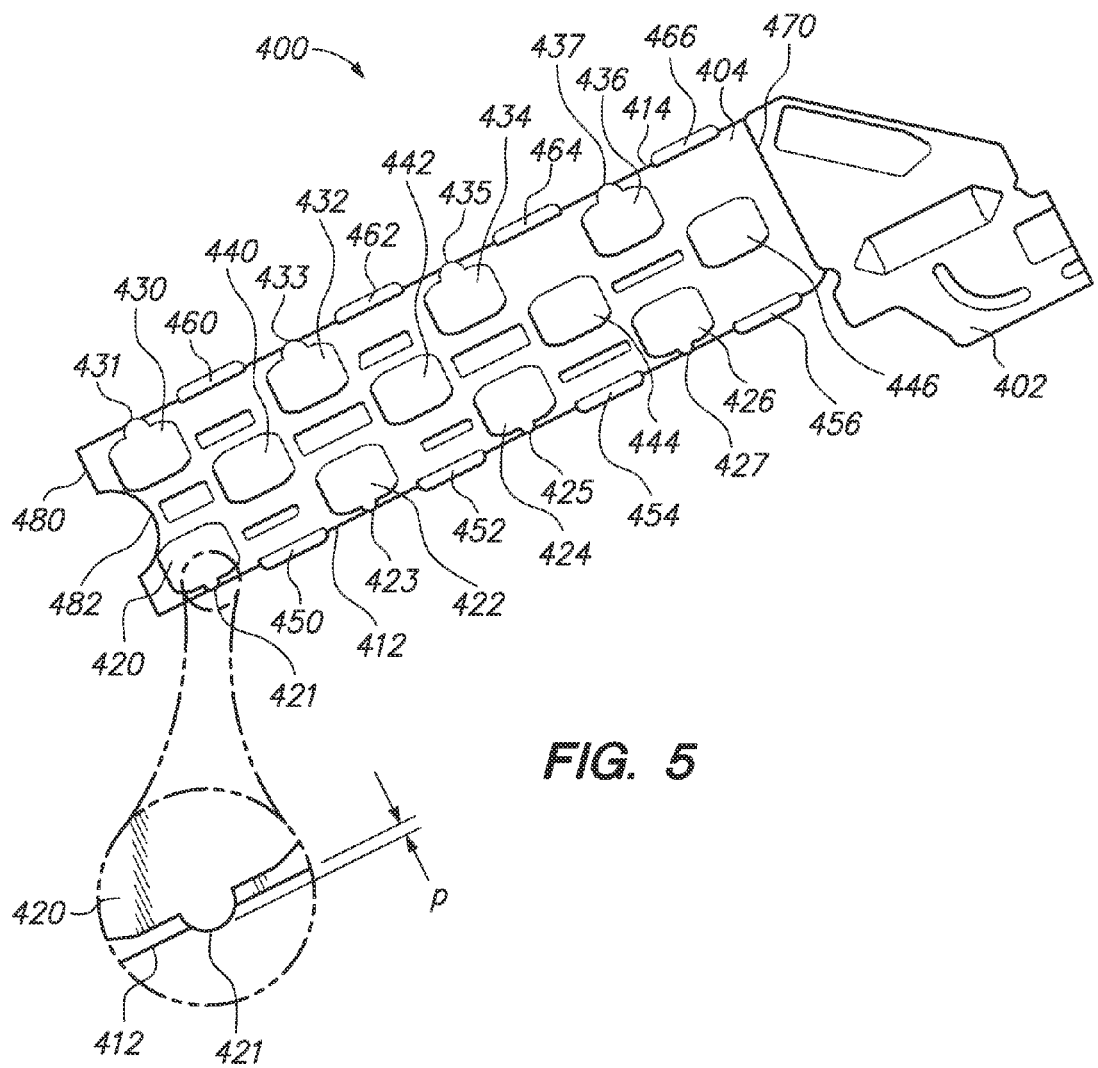
FIG. 5 is an assembled plan view of the flexure tail terminal region of FIG. 4, as viewed from the structural layer side.
Figure 6:
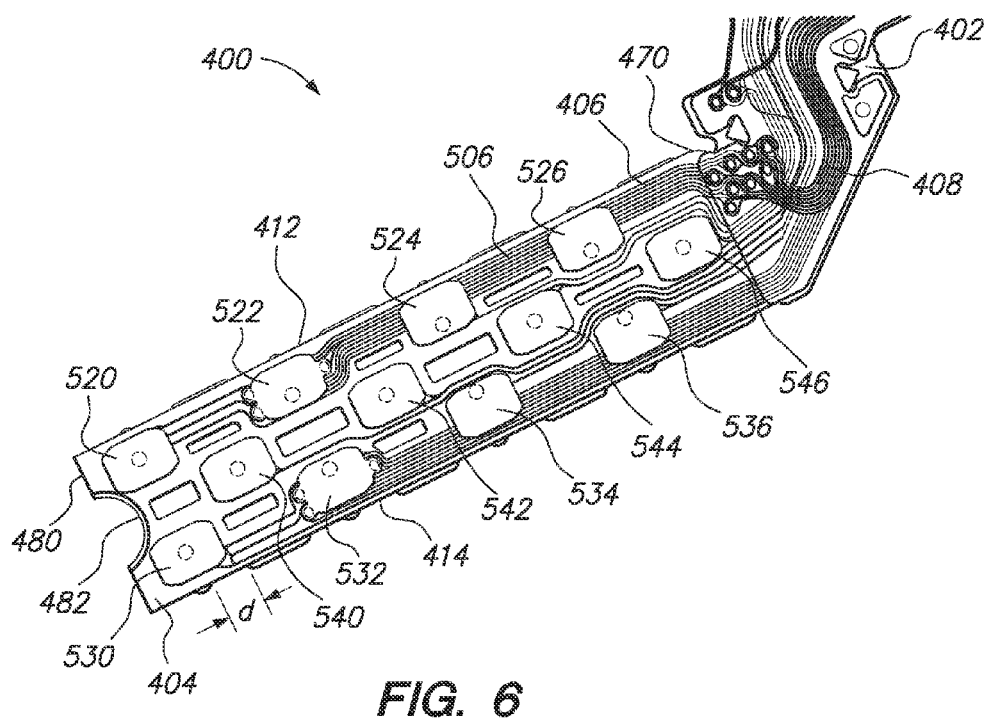
FIG. 6 is an assembled plan view of the flexure tail terminal region of FIG. 4, as viewed from the conductive layer side.

FIG. 4 is an exploded perspective view of a flexure tail terminal region 400 according to an embodiment of the present invention. FIG. 5 is an assembled plan view of the flexure tail terminal region 400, as viewed from the structural layer side. FIG. 6 is an assembled plan view of the flexure tail terminal region 400, as viewed from the conductive layer side. Now referring to FIGS. 4, 5, and 6 the flexure tail terminal region 400 includes a structural layer 402 (e.g. stainless steel), a conductive layer 406 (e.g. copper), and a dielectric layer 404 (e.g. polyimide) between the structural layer 402 and the conductive layer 406. In certain embodiments, the flexure tail terminal region 400 may optionally also include a second upper dielectric layer 407 and a second upper conductive layer 408 to provide additional conductive paths for dual layer interleaved flexure tails, for example. The dielectric layer 407 may prevent shorting of certain conductive traces 506 by overlying features of the second upper conductive layer 408.

In the embodiment of FIGS. 4, 5, and 6, the conductive layer 406 is patterned by etching to define a plurality of conductive traces 506. The flexure tail terminal region 400 is bounded by two straight and parallel opposing longitudinal edges 412, 414, which are the longest edges of the flexure tail terminal region 400. In the embodiment of FIGS. 4, 5, and 6, the second upper conductive layer 408 may include twelve flexure bond pads 606, including bond pad 520, 522, 524, 526, 530, 532, 534, 536, 540, 542, 544, and 546, that may be in electrical communication with a read head or ground plane, and that are disposed between the two opposing longitudinal edges 412, 414 of the dielectric layer 404.

In the embodiment of FIGS. 4, 5, and 6, each of the twelve flexure bond pads 606 is oriented to facilitate alignment with corresponding ones of a plurality of FPC bond pads. In certain embodiments, each of the twelve flexure bond pads 606 is coated by an anisotropic conductive film, and is bonded to a corresponding FPC bond pad by the anisotropic conductive film during the head stack assembly process. In the embodiment of FIG. 4, vias (e.g. vias 672) through the second upper dielectric layer 407 may facilitate connection of bond pads 606 to underlying conductive traces 506, and/or interleaving and connection of traces 506 to traces in the second upper conductive layer 408.

In the embodiment of FIGS. 4, 5, and 6, the structural layer 402 includes a plurality of discontinuous islands 602, including discontinuous islands, 420, 422, 424, 426, 430, 432, 434, 436, 440, 442, 444, and 446. In the embodiment of FIGS. 4, 5, and 6, each of the discontinuous islands 420, 422, 424, 426 has an optional side protrusion 421, 423, 425, 427, respectively, that extends to the longitudinal edge 412 that is nearest that island. In certain embodiments, the side protrusions 421, 423, 425, 427 extend beyond the longitudinal edge 412 by a protrusion distance (for example, the protrusion distance p of the side protrusion 421 of the discontinuous island 420, beyond the longitudinal edge 412 of the dielectric layer 404 of the flexure tail terminal region 400). In this context, the protrusion distance p is measured orthogonally with respect to the longitudinal edge 412 of the flexure tail terminal region 400. In certain embodiments, the protrusion distance p is preferably in the range of 20 microns to 200 microns.

Likewise, each of the discontinuous islands 430, 432, 434, 436 has an optional side protrusion 431, 433, 435, 437, respectively, that extends to the longitudinal edge 414 that is nearest that island. In certain embodiments, the side protrusions 431, 433, 435, 437 extend beyond the longitudinal edge 414 by a protrusion distance (for example by a protrusion distance that is measured orthogonally with respect to the longitudinal edge 414 of the flexure tail terminal region 400, and that may optionally be the same as the protrusion distance p). Note that in the embodiment of FIG. 4, the discontinuous islands 440, 442, 444, 446 do not have any side protrusions, which would be of no use because the discontinuous islands 440, 442, 444, 446 are not disposed adjacent to either of the opposing longitudinal edges 412, 414.

In the embodiment of FIGS. 4, 5, and 6, the plurality of discontinuous islands 602 of the structural layer 402 further includes discontinuous edge reinforcing islands 450, 452, 454, 456, 460, 462, 464, 466. The discontinuous islands 450, 452, 454, and 456 reinforce and protrude beyond the longitudinal edge 412 by a protrusion distance (optionally also by protrusion distance p, for example). The discontinuous islands 460, 462, 464, and 466 reinforce and protrude beyond the longitudinal edge 414 by a protrusion distance (optionally also by protrusion distance p, for example).

In certain embodiments, contact between a contacting component of an alignment tool and one or more of the side protrusions 421, 423, 425, 427 and/or 431, 433, 435, 437, and/or the edge reinforcing islands 450, 452, 454, 456, and/or 460, 462, 464, and 466, can facilitate alignment of the flexure tail terminal region 400 with an FPC during the head stack assembly process.

In certain embodiments, adjacent ones of the discontinuous islands 420, 450, 422, 452, 424, 454, 426, 456, and adjacent ones of the discontinuous islands 430, 460, 432, 462, 434, 464, 436, 466 are separated by a longitudinal spacing measured along the longitudinal edge 412 or the longitudinal edge 414 (e.g. the discontinuous island 430 is separated from the adjacent edge reinforcing island 460 by a longitudinal spacing d, measured along the longitudinal edge 414), that is preferably no greater than thirty times the protrusion distance p.

Note that in the foregoing context, the longitudinal spacing between adjacent discontinuous islands is measured in a longitudinal direction between two adjacent discontinuous islands protruding over the same longitudinal edge, along that longitudinal edge. In certain embodiments, the longitudinal spacing d measured along the longitudinal edge 414 may preferably be no greater than 0.6 mm. In certain embodiments, the longitudinal spacing d may preferably be no greater than 20% of the total longitudinal span (that overlaps the FPC) of the flexure tail terminal region 400. In certain embodiments, the total longitudinal span of the flexure tail terminal region 400 (e.g. from the proximal end 470 to the distal end 480) may be in the range of 3.5 mm to 5.5 mm.

In certain embodiments, the foregoing features and dimensional limitations can help facilitate travel of an automatic long tail (ALT) combing/alignment tool along the longitudinal outer edges 412, 414 of the flexure tail terminal region 400 to align the flexure tail terminal region 400 during the head stack assembly process. The foregoing features and dimensional limitations may also prevent damage of the flexure tail terminal region 400 during the alignment process, because the protrusions of the islands 602 in the structural layer 402, and/or the edge reinforcing islands 450, 452, 454, 456, and/or 460, 462, 464, and 466, may beneficially prevent contact of the alignment tool with the longitudinal edges 412, 414 of the dielectric layer 404.

For example, the protrusion of discontinuous islands of the structural layer 402 beyond the longitudinal edges 412, 414 of the dielectric layer 404, may prevent contact between the alignment tool and the longitudinal edge 412 or 414 of the dielectric layer 404, despite an angular misalignment of the flexure tail relative to the tool. In the embodiment of FIGS. 4, 5, and 6, if the protrusion distance p is 50 microns and the longitudinal spacing d is no greater than 140 microns, then the alignment tool will not contact the longitudinal edges 412, 414 of the dielectric layer 404, even if the tail misalignment angle reaches 20 degrees (e.g. is in the range of 5 to 20 degrees). If the tail misalignment angle is not expected to exceed 10 degrees, then the longitudinal spacing d may safely be increased to 0.28 mm in the foregoing example.

In the embodiment of FIGS. 4, 5, and 6, the structural layer islands 420, 422, 424, 426, 430, 432, 434, 436, 440, 442, 444, and 446, which back the flexure tail bond pads 606 may also serve to transfer heat and pressure from a flat thermode tool to the plurality of bond pads 606 (simultaneously), for example to facilitate ACF bonding. In certain embodiments, the thickness of the structural layer 402 may be preferably less than 20 microns, the thickness of the dielectric layer 404 may be preferably less than 15 microns, the thickness of the conductive layer 406 may be preferably less than 15 microns. In the embodiment of FIG. 4, the dielectric layer 404 may optionally include a plurality of through openings 622, for example to control the spread of solder used to make electrical connections to the bond pads 606.

Now referring to FIGS. 3, 4, and 5, in certain embodiments the FPC 260 preferably may be designed so that the FPC electrical conduits 382 are not disposed in locations that would overlap with the discontinuous edge stiffener islands 450, 452, 454, 456, 460, 462, 464, 466 (i.e. the islands in the structural layer 402 that reinforce the longitudinal outer edges 412, 414 of the flexure tail terminal region 400, but that are not coincident with flexure tail bond pads 606). Otherwise, such locations may be subject to undesirably high pressure from a thermode tool during the process of bonding the flexure tail terminal region 400 to the FPC 260, which may undesirably reduce the pressure or uniformity of pressure applied to the bond pads 606 by the thermode tool. Likewise, FPC electrical conduits 382 are preferably not disposed in locations that would overlap with any frame or peninsula that may optionally be included in the structural layer 402 of the flexure tail terminal region 400 to increase the rigidity of the longitudinal outer edges 412, 414 (e.g. to facilitate alignment during bonding steps of the head stack assembly process).

In the embodiment of FIGS. 4, 5, and 6, the distal end 480 of the flexure tail terminal region 400 has an arcuate recession 482. In certain embodiments, the discontinuous islands 420 and/or 430 may be disposed no more than 50 microns from the arcuate recession 482, for example to reinforce or stiffen the arcuate recession 482. Such reinforcement or stiffening of the arcuate recession 482 may facilitate its use as a possible registration surface for an alignment tool, to help align the flexure tail terminal region 400 relative to a FPC during the head stack assembly process, and/or relative to electrical connection pins during HGA dynamic electrical testing.

Figure 7:
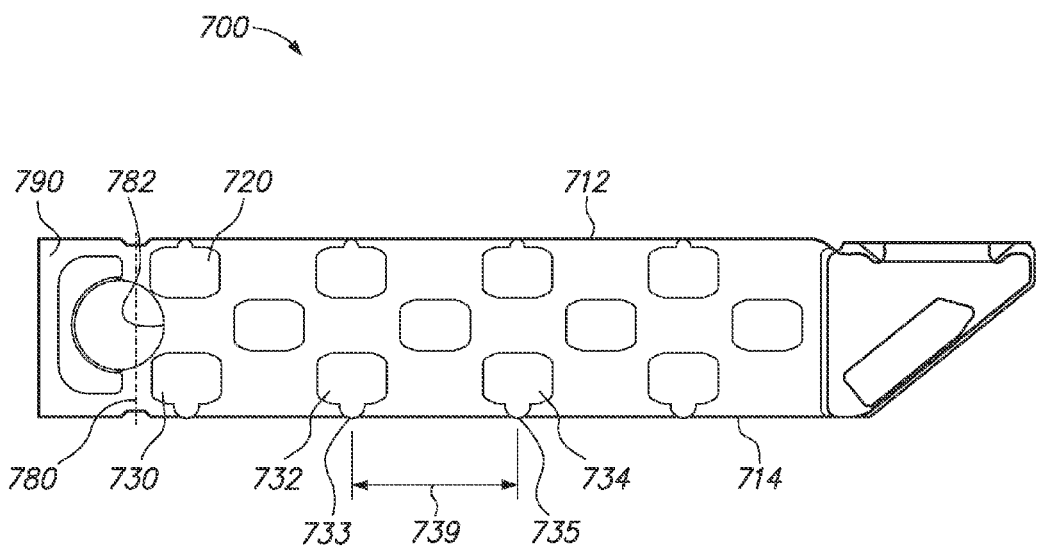
FIG. 7 is an assembled plan view of a flexure tail terminal region according to another embodiment of the present invention, as viewed from the structural layer side.

FIG. 7 is an assembled plan view of a flexure tail terminal region 700 according to another embodiment of the present invention, as viewed from the structural layer side. The flexure tail terminal region 700 is bounded by two straight and parallel opposing longitudinal edges 712, 714, which are the longest edges of the flexure tail terminal region 700.

In the embodiment of FIG. 7, the flexure tail terminal region 700 includes a plurality of structural layer discontinuous islands (e.g. structural layer discontinuous islands, 720, 730, 732, 734). In the embodiment of FIG. 7, some of the plurality of structural layer discontinuous islands include an optional side protrusion (e.g. side protrusions 733, 735) that extend beyond a longitudinal edge of the flexure tail terminal region 700 by a protrusion distance (measured orthogonally with respect to that longitudinal edge). In certain embodiments, such protrusion distance may preferably be the range of 20 microns to 200 microns.

In certain embodiments, adjacent ones of the structural layer discontinuous islands along the longitudinal edges 712, 714 of the flexure tail terminal region 700 may preferably be separated by a longitudinal spacing (measured along one of the longitudinal edges 712, 714). For example, the adjacent structural layer discontinuous islands 732 and 734 are separated by a longitudinal spacing 739, measured along the longitudinal edge 714 of the flexure tail terminal region 700. In certain embodiments, the longitudinal spacing 739 is preferably no greater than thirty times the protrusion distance of the side protrusions 733, 735.

In certain embodiments, the longitudinal spacing 739 measured along the longitudinal edge 714 may preferably be no greater than 0.6 mm. In certain embodiments, the longitudinal spacing 739 may preferably be no greater than 20% of the total longitudinal span (that overlaps the FPC) of the flexure tail terminal region 700. In certain embodiments, the total longitudinal span of the flexure tail terminal region 700 (that overlaps the FPC) may be in the range of 3.5 mm to 5.5 mm.

In certain embodiments, the foregoing features and dimensional limitations can help facilitate travel of an alignment tool along the longitudinal outer edges 712, 714 of the flexure tail terminal region 700, to align the flexure tail terminal region 700 during the head stack assembly process. The foregoing features and dimensional limitations may also prevent damage of the flexure tail terminal region 700 during the alignment process, because the protrusions of certain discontinuous structural layer islands may beneficially prevent contact by the alignment tool with unreinforced regions of the longitudinal edges 712, 714 during the head stack assembly process, despite an initial angular misalignment of the flexure tail relative to the alignment tool.

In the embodiment of FIG. 7, the flexure tail terminal region 700 is considered to exclude a distal tab 790 that is cut away at cut line 780 during the manufacturing process. Thereafter, the cut line 780 becomes the distal end 780 of the flexure tail terminal region 700, with the distal end 780 of the flexure tail terminal region 700 having an arcuate recession 782. In certain embodiments, the discontinuous islands 720 and/or 730 may be disposed no more than 50 microns from the arcuate recession 782, for example to reinforce or stiffen the arcuate recession 782. Such reinforcement or stiffening of the arcuate recession 782 may facilitate its use as a possible registration surface by an alignment tool, to help align the flexure tail terminal region 700 relative to a FPC during the head stack assembly process, and/or relative to electrical connection pins during HGA dynamic electrical testing.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A disk drive comprising:
   a disk drive base;
   a disk rotably mounted to the disk drive base;
   an actuator rotably mounted to the disk drive base, the actuator including at least one actuator arm and a flexible printed circuit (FPC) that includes a plurality of electrically conductive FPC bond pads; and
   at least one head gimbal assembly attached to the at least one actuator arm, the at least one head gimbal assembly comprising
      a head for reading and writing data on the disk; and
      a suspension assembly that comprises
         a load beam, and
         a flexure that comprises a structural layer, a dielectric layer, and a conductive layer, the flexure including a tongue portion bonded to the head and a flexure tail that extends to the plurality of FPC bond pads;
   wherein the flexure tail includes a flexure tail terminal region that overlaps the FPC, the dielectric layer in the flexure tail terminal region being bounded by first and second longitudinal edges, the flexure tail terminal region including a plurality of flexure bond pads in electrical communication with the head, each of the plurality of flexure bond pads being aligned with a corresponding one of the plurality of FPC bond pads, the flexure tail terminal region including a first plurality of discontinuous islands in the structural layer;
   wherein each of at least three of the first plurality of discontinuous islands extends over the first longitudinal edge by a protrusion distance; and
   wherein adjacent ones of the at least three of the first plurality of discontinuous islands are separated by a first longitudinal spacing, measured along the first longitudinal edge, that is no greater than thirty times the protrusion distance.

2. The disk drive of claim 1 wherein the structural layer comprises stainless steel, the dielectric layer comprises polyimide, and the conductive layer comprises copper.

3. The disk drive of claim 1 wherein the protrusion distance is in the range of 20 microns to 200 microns.

4. The disk drive of claim 1 wherein each of the plurality of flexure bond pads is bonded to the corresponding one of the plurality of FPC bond pads by an anisotropic conductive film.

5. The disk drive of claim 1 wherein the flexure tail terminal region further includes a second plurality of discontinuous islands in the structural layer, and wherein each of at least three of the second plurality of discontinuous islands extends over the second longitudinal edge by the protrusion distance, and wherein adjacent ones of the at least three of the second plurality of discontinuous islands are separated by a second longitudinal spacing, measured along the second longitudinal edge, that is no greater than thirty times the protrusion distance.

6. The disk drive of claim 1 wherein a total longitudinal span of the flexure tail terminal region that overlaps the FPC is in the range of 3.5 mm to 5.5 mm.

7. The disk drive of claim 6 wherein the first longitudinal spacing is no greater than 20% of the total longitudinal span.

8. The disk drive of claim 1 wherein the flexure tail terminal region further comprises a distal end having an arcuate recession, and wherein at least one of the first plurality of discontinuous islands is disposed no more than 50 microns from the arcuate recession.

9. The disk drive of claim 1 wherein each of at the least three of the first plurality of discontinuous islands has a side protrusion that extends over the first longitudinal edge by the protrusion distance, and wherein not all of the first plurality of discontinuous islands have a side protrusion.

10. The disk drive of claim 5 wherein each of at the least three of the second plurality of discontinuous islands has a side protrusion that extends over the second longitudinal edge by the protrusion distance.

11. A head gimbal assembly (HGA) for a disk drive, the HGA comprising:
   a head for reading and writing data; and
   a suspension assembly that comprises
      a load beam, and
      a flexure that comprises a structural layer, a dielectric layer, and a conductive layer, the flexure including
         a proximal tongue portion that connects to the head and
         a flexure tail that extends away from the proximal tongue portion to a distal flexure tail terminal region, the dielectric layer in the distal flexure tail terminal region being bounded by first and second longitudinal edges;
   wherein the distal flexure tail terminal region includes a plurality of flexure bond pads in electrical communication with the head, and the distal flexure tail terminal region includes a first plurality of discontinuous islands in the structural layer;
   wherein each of at least three of the first plurality of discontinuous islands extends over the first longitudinal edge by a protrusion distance; and
   wherein adjacent ones of the at least three of the first plurality of discontinuous islands are separated by a first longitudinal spacing, measured along the first longitudinal edge, that is no greater than thirty times the protrusion distance.

12. The HGA of claim 11 wherein the structural layer comprises stainless steel, the dielectric layer comprises polyimide, and the conductive layer comprises copper.

13. The HGA of claim 11 wherein each of the plurality of flexure bond pads is coated by an anisotropic conductive film material.

14. The HGA of claim 11 wherein a total longitudinal span of the distal flexure tail terminal region is in the range of 3.5 mm to 5.5 mm.

15. The HGA of claim 14 wherein the first longitudinal spacing is no greater than 20% of the total longitudinal span.

16. The HGA of claim 11 wherein each of at the least three of the first plurality of discontinuous islands has a side protrusion that extends over the first longitudinal edge by the protrusion distance, and wherein not all of the first plurality of discontinuous islands have a side protrusion.

17. The HGA of claim 11 wherein the distal flexure tail terminal region further includes a second plurality of discontinuous islands in the structural layer, and wherein each of at least three of the second plurality of discontinuous islands extends over the second longitudinal edge by the protrusion distance, and wherein adjacent ones of the at least three of the second plurality of discontinuous islands are separated by a second longitudinal spacing, measured along the second longitudinal edge, that is no greater than thirty times the protrusion distance.

18. The HGA of claim 17 wherein each of at the least three of the second plurality of discontinuous islands has a side protrusion that extends over the second longitudinal edge by the protrusion distance.

19. The HGA of claim 11 wherein the distal flexure tail terminal region further comprises a distal end having an arcuate recession, and wherein at least one of the first plurality of discontinuous islands is disposed no more than 50 microns from the arcuate recession.

20. The HGA of claim 11 wherein the protrusion distance is in the range of 20 microns to 200 microns.

21. A head gimbal assembly (HGA) for a disk drive, the HGA comprising:
   a head for reading and writing data; and
   a suspension assembly that comprises
      a load beam, and
      a flexure that comprises a structural layer, a dielectric layer, and a conductive layer, the flexure including
         a proximal tongue portion that connects to the head and
         a flexure tail that extends away from the proximal tongue portion to a distal flexure tail terminal region, the dielectric layer in the distal flexure tail terminal region being bounded by first and second longitudinal edges;
   wherein the distal flexure tail terminal region includes a plurality of flexure bond pads in electrical communication with the head, and the distal flexure tail terminal region includes a first plurality of discontinuous islands in the structural layer;
   wherein each of at least three of the first plurality of discontinuous islands extends over the first longitudinal edge by a protrusion distance; and
   wherein adjacent ones of the at least three of the first plurality of discontinuous islands are separated by a first longitudinal spacing, measured along the first longitudinal edge, that is no greater than 0.6 mm.

22. The HGA of claim 21 wherein each of at the least three of the first plurality of discontinuous islands has a side protrusion that extends over the first longitudinal edge by the protrusion distance, and wherein not all of the first plurality of discontinuous islands have a side protrusion.

23. The HGA of claim 21 wherein the distal flexure tail terminal region further includes a second plurality of discontinuous islands in the structural layer, and wherein each of at least three of the second plurality of discontinuous islands extends over the second longitudinal edge by the protrusion distance, and wherein adjacent ones of the at least three of the second plurality of discontinuous islands are separated by a second longitudinal spacing, measured along the second longitudinal edge, that is no greater than thirty times the protrusion distance.

24. The HGA of claim 23 wherein each of at the least three of the second plurality of discontinuous islands has a side protrusion that extends over the second longitudinal edge by the protrusion distance.

25. The HGA of claim 21 wherein the distal flexure tail terminal region further comprises a distal end having an arcuate recession, and wherein at least one of the first plurality of discontinuous islands is disposed no more than 50 microns from the arcuate recession.

26. The HGA of claim 21 wherein the protrusion distance is in the range of 20 microns to 200 microns.

* * * * *